United States Patent [19]

Miwa et al.

[11] Patent Number: 5,228,139
[45] Date of Patent: Jul. 13, 1993

[54] SEMICONDUCTOR INTEGRATED CIRCUIT DEVICE WITH TEST MODE FOR TESTING CPU USING EXTERNAL SIGNAL

[75] Inventors: Yoshiyuki Miwa, Kawasaki; Tsuyoshi Jouno, Koganei; Haruo Keida, Tokorozawa; Kunihiko Nakada, Kodaira; Hajime Yasuda, Tachikawa, all of Japan

[73] Assignees: Hitachi Ltd.; Hitachi Microcomputer Engineering Ltd., Tokyo, Japan

[21] Appl. No.: 840,633

[22] Filed: Feb. 21, 1992

Related U.S. Application Data

[63] Continuation of Ser. No. 339,089, Apr. 17, 1989, abandoned.

[30] Foreign Application Priority Data

Apr. 19, 1988 [JP] Japan ................. 63-96083

[51] Int. Cl.[5] ............................................. G06F 11/22
[52] U.S. Cl. ....................................... 395/575; 395/275; 364/DIG. 1; 364/266; 364/238; 364/232.8; 364/232.9; 371/22.6
[58] Field of Search ..................... 371/22.6, 22.4; 395/575

[56] References Cited

U.S. PATENT DOCUMENTS

| | | | |
|---|---|---|---|
| 4,216,539 | 8/1980 | Raymond et al. | 371/22.4 |
| 4,455,654 | 6/1984 | Bhaskar et al. | 371/22.6 |
| 4,467,420 | 8/1984 | Murakami et al. | 364/200 |
| 4,641,308 | 2/1987 | Sacarisen et al. | 371/16 |
| 4,837,677 | 6/1989 | Burrus | 395/425 |
| 4,993,027 | 2/1991 | McGraw et al. | 371/22.4 |
| 5,051,997 | 9/1991 | Sakashita et al. | 371/22.4 |
| 5,101,498 | 3/1992 | Ehlig et al. | 395/800 |

FOREIGN PATENT DOCUMENTS 272668 12/1986 Japan .
38949 2/1987 Japan .

Primary Examiner—Lawrence E. Anderson
Attorney, Agent, or Firm—Fay, Sharpe, Beall, Fagan, Minnich & McKee

[57] ABSTRACT

An output gate means is provided which is capable of outputting individual signals selectively to an internal bus; the individual signals are interchanged among a plurality of functional modules connected to the internal bus which is interfaced with an external circuit. An input gate means is provided which is capable of supplying selectively a signal, input to the internal bus, to a specified functional module in place of an individual signal.

22 Claims, 3 Drawing Sheets

SEMICONDUCTOR INTEGRATED CIRCUIT DEVICE WITH TEST MODE FOR TESTING CPU USING EXTERNAL SIGNAL

This is a continuation of application Ser. No. 07/339,089, filed Apr. 17, 1989, now abandoned.

BACKGROUND OF THE INVENTION

The present invention relates to a semiconductor integrated circuit and further relates to techniques to facilitate debugging or device tests on individual signals interchanged between functional modules contained in the semiconductor integrated circuit. For example, it relates to a technique which is effectively applied to a microcomputer constituted in an application specific system.

Many functional modules are mounted on a semiconductor integrated circuit such as a single-chip microcomputer which is constituted with a plurality of functional modules on a semiconductor substrate. The modules mounted are, for example as shown in FIG. 4, a CPU (central processing unit) 1, a DMA (direct-memory-access) controller 2, a timer 3, a serial interface controller (not shown in the drawing) and other peripheral circuits. These functional modules are connected to an internal bus 4 which includes an address bus, a data bus and a control bus. Common signals such as data, address signals or control signals can be interchanged among functional modules and especially between the CPU and the modules. Signals necessary for the operation of these functional modules are not only the above-mentioned common signals, there also are some individual signals which have to be interchanged individually between specified modules. Following are examples of these signals: a DMA request signal DREQ by the DMA controller 2 requesting CPU 1 to open the common internal bus 4, a DMA acknowledgment signal DACK which is a response signal to a DMA request, an interruption signal INT2 or INT3 for specifying an interruption to be given to the CPU 1 by the DMA controller 2 or the timer 3. It has been considered that these individual signals are exclusively used for the handshake control between the specified functional modules, so that the individual signals are not open to the outside and also there is no need to be open to the outside, while the internal bus 4, forming a contrast with the above signals, is arranged to be capable of being interfaced with the outside through an input/output circuit 5.

In the device test of a semiconductor integrated circuit such as a single-chip microcomputer where individual signals are interchanged among built-in functional modules, concerning common signals, a signal can be supplied to a desired functional module from the outside through the internal bus 4 and the module can be tested being independently controlled. But in the case of an individual signal which such as an interruption signal is not open to the outside, it is impossible to supply the signal from outside or to confirm the outputting condition of the signal from outside. In a test of individual signals therefore, it is necessary to operate both functional modules simultaneously; between them a specified individual signal is interchanged. According to the investigation made by the present inventors, to confirm the outputting condition of a specified individual signal and the operating condition of a functional module which is to receive the individual signal, it is necessary to make the functional module, which is to output the individual signal, perform an operation necessary to obtain the desired outputting condition of the signal, and to make the functional module to receive the signal perform an operation which is capable of reflecting the condition of the individual signal. Therefore, the points to be discussed are the a long time needed for the test on individual signals and also for making test patterns.

In a semiconductor integrated circuit device which has a plurality of built-in logical functional blocks, the documents on the technique to take out an individual signal to be used among the above-mentioned logical functional blocks to the outside of the semiconductor integrated circuit device and to supply a test signal input from outside the semiconductor integrated circuit device to a specified logical functional block, are listed as shown below.

U.S. patent application of Ser. No. 199,605, now U.S. Pat. No. 4,967,387.

Japanese Patent Application laid open on Feb. 2, 1987 under Provisional Publication No. 38949/87

Japanese Patent Application laid open on Dec. 2, 1986 under Provisional Publication No. 272668/86

The semiconductor integrated circuits described in the above patent application documents are provided with exclusive use signal lines added for tests.

SUMMARY OF THE INVENTION

In a semiconductor integrated circuit such as an application specific microcomputer which corresponds to individual specification requirements by making an arbitrary combination of peripheral functional modules possible a CPU is centered to be the core of the system, for every different combination of peripheral functional modules which are adopted corresponding to required specifications, a different test pattern has to be made. As a result, the problem mentioned above was found to be more conspicuous.

When a system is so designed that a signal line for a test can be added, there is a probability that the degree of integration of built-in peripheral functional modules can be degraded.

The purpose of the present invention is to provide a semiconductor integrating circuit in which a device test on individual signals to be interchanged among built-in functional modules is made simple and further making a high degree of integration of builtin modules possible.

The purposes of the present invention as described above, and the new features of the present invention will be made clear by the descriptions and the drawings in the present specification.

Following is a brief description of the outline of a representative example of the invention to be disclosed in the present application.

An output gate means is provided through which selective outputting of an individual signal to an internal bus is possible. The individual signal is interchanged between plural functional modules connected to the internal bus which can be interfaced with an external circuit; an input gate means is provided through which a signal supplied to an internal bus can be selectively supplied to a specified functional module in place of an individual signal.

In place of the output gate means and the input gate means, a signal separation means which can alternatively select one out of the three conditions as shown below: a condition under which an individual signal, which is exchanged between plural functional modules connected to an internal bus which can be interfaced with an external circuit, can be supplied from a specified functional module to the other specified modules; a condition under which the individual signal output from a specified functional module can be output to the internal bus; a condition under which a signal supplied from an external circuit to the internal bus is supplied to the other specified functional module in place of an individual signal.

According to the means as described in the above, in a device test or the like on individual signals, an individual signal output from a specified functional module is supplied to the internal bus through the output gate means. Therefore the outputting condition of the individual signal can be confirmed directly at the outside through the internal bus interfaced with an external circuit. Thereby the outputting condition of a desired individual signal can be simply confirmed without making a functional module which is to receive the individual signal perform an operation in which the condition of the individual signal is reflected.

In a device test or the like on individual signals, a signal supplied directly from an external circuit to the internal bus is supplied to a desired functional module through the input gate means in place of an individual signal. Such that the operating condition of the functional module based on the desired individual signal can be simply confirmed without making the functional module which is to originally output the individual signal perform an operation necessary to obtain the desired outputting condition of the individual signal.

The signal separation means selectively unifies the flow of an individual signal output form the specified functional module to the internal bus or to the other functional module which is to receive the individual signal. The signal separation means also functions to avoid the conflict between an individual signal output from the specified functional module and a signal which is supplied from outside in place of an individual signal. In the case of an individual signal which serves as a trigger signal for starting an operation such as a request signal of an operation or a response signal for it, when the outputting condition of the individual signal is directly confirmed in the outside, the functional module which is to originally receive the individual signal is automatically suppressed to start an original operation stimulated by the individual signal. When the operating condition of a functional module which is to receive a specified individual signal is to be confirmed based on a substitute signal of an individual signal supplied from outside, the starting of an operation by an original individual signal is suppressed. The independent test of a desired functional module on an individual signal is thereby facilitated.

DESCRIPTION OF THE PREFERRED EMBODIMENTS

Figure 1:
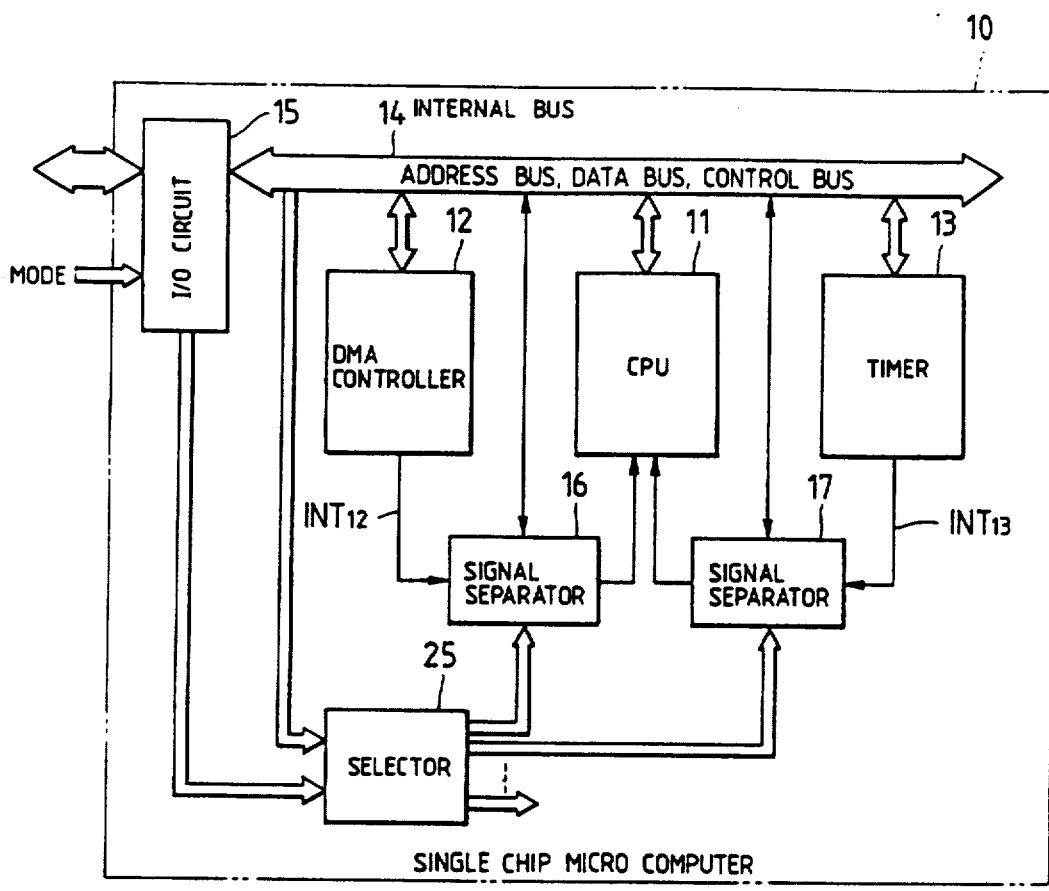
FIG. 1 is an outline block diagram of a single-chip microcomputer which is an embodiment of the present invention.
Figure 4:
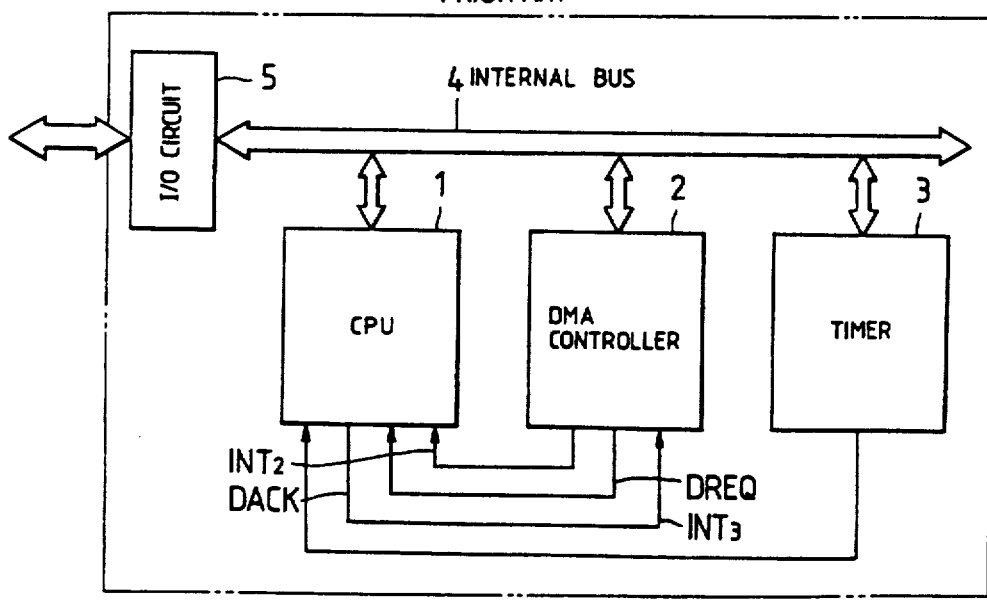
FIG. 4 is an outline block diagram of a conventional single-chip microcomputer.

FIG. 1 shows a single-chip microcomputer which is an embodiment of the present invention. The single-chip microcomputer shown in the drawing is formed on a semiconductor substrate like a single crystal silicon substrate by a known semiconductor integrated circuit manufacturing technique.

On the single-chip microcomputer 10 shown in FIG. 1 there are mounted, but not specially limited to, a centered CPU 11 a DMA controller 12, a timer 13, a serial interface controller (not shown in the drawing) and other peripheral circuits in a so called application specific system. These functional modules are connected to the internal bus 14 including an address bus AB, a data bus DB, a control bus CB. Data or common signals such as address signals and control signals can be interchanged among the functional modules. The internal bus 14 is arranged to be capable of interfacing with an external circuit through an input/output circuit 15. As representative individual signals which are exchanged among functional modules, interruption signals INT12, INT13 are shown in FIG. 1. These interruption signals INT12, INT13 can be supplied to the CPU 11 through signal separation circuits 16 and 17 respectively.

The signal separation circuit 16 selects one in an alternative way out of three conditions as shown below: a condition under which the interruption signal INT12 output from the DMA controller 12 is supplied to the CPU 11; a condition under which the interruption signal INT12 is output to a specified signal line of the data bus DB included in the internal bus 14; and a condition under which a signal supplied from outside to the internal bus 14 is supplied to an input terminal of the interruption signal INT12 of the CPU 11.

In the similar way to the above, the signal separation circuit 17 selects one in an alternative way out of three conditions as shown below: a condition under which the interruption signal INT13 output from the timer 13 is supplied to the CPU 11; a condition under which the interruption signal INT13 is output to a specified signal line of the data bus DB included in the internal bus 14; a condition under which a signal supplied from outside to the internal bus 14 is supplied to an input terminal of the interruption signal INT13 of the CPU 11.

Figure 2:
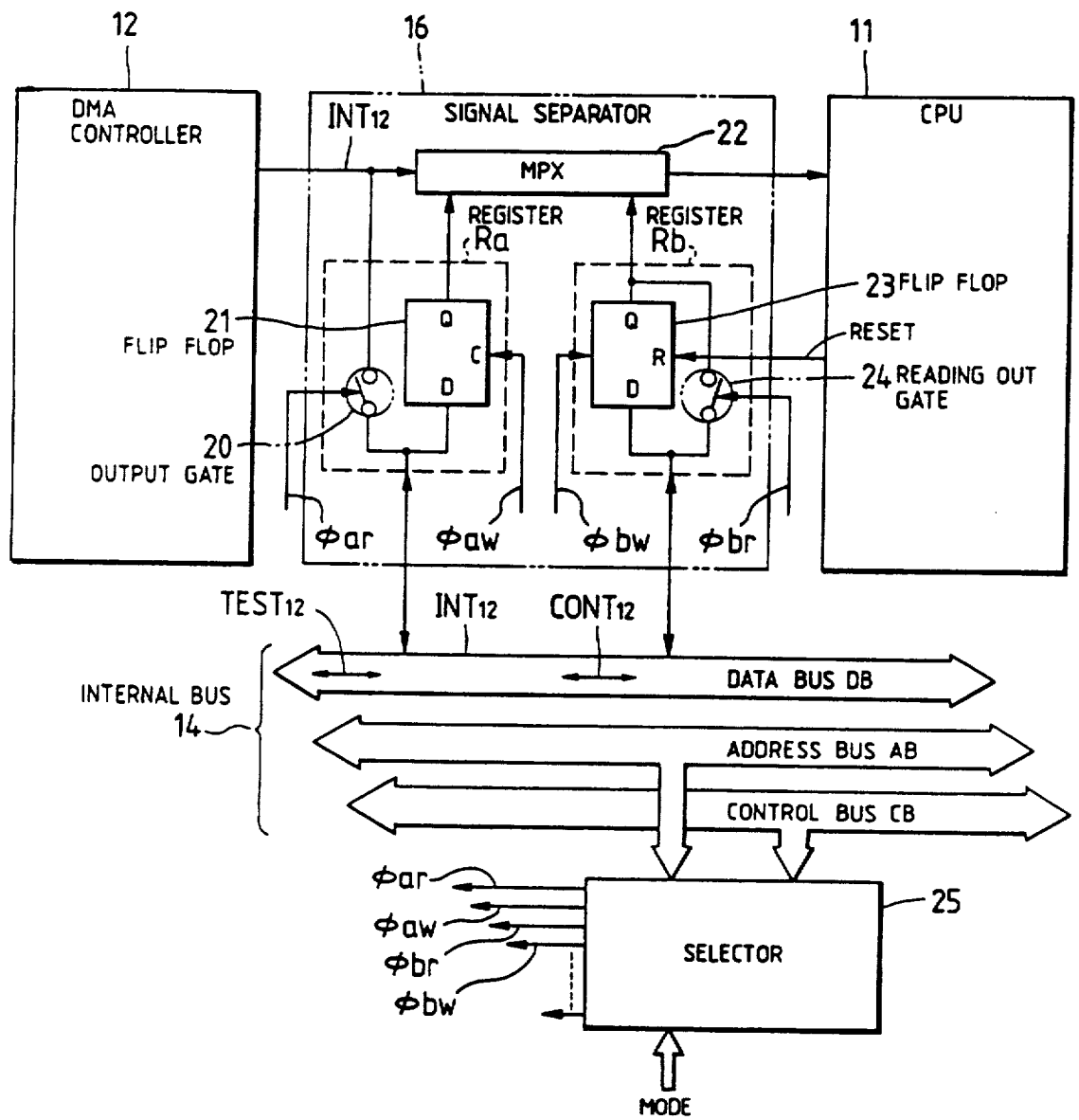
FIG. 2 is a block diagram showing a detailed example of a signal separator.

FIG. 2 shows a detailed example of the signal separation circuit 16.

The signal separation circuit 16 comprises an output gate 20 which gives an interruption signal INT12 output from the DMA controller 12 to a specified signal line of the data bus DB; a flip-flop circuit 21 which latches a test signal TEST12 supplied from outside through a specified signal line of the data bus DB for the substitution of an interruption signal INT12 in the case of a device test etc.; a multiplexer 22 which supplies a test signal TEST12 output from the flip-flop circuit 21 or an interruption signal INT12 output from the DMA controller 12 in an alternative way to the CPU 11; a flip-flop circuit 23 to perform output selection control of the multiplexer 22 in latching a switchover control signal CONT12 supplied from outside through a specified signal line of the data bus DB; a reading out gate 24 to make the confirmation at the outside possible in reading out the latched data of the flip-flop circuit 23 into the data bus DB.

The output gate 20 and the flip-flop circuit 21, and the flip-flop circuit 23 and the reading out gate 24 can be regarded as a registers Ra and Rb respectively.

Addresses are given to the registers Ra and Rb, to be more precise, addresses are given to each of these; output gate 20, flip-flop circuit 21, flip-flop circuit 23, and reading out gate 24 which constitute registers Ra and Rb. Addresses thus allotted can be mapped in the same address area as that of the registers included in the functional modules such as CPU 11, but in this embodiment they are mapped in an area of their own commonly using the bits with all or part of a mode signal MODE which is supplied from outside. When a test operation is specified to the single-chip microcomputer 10 by a mode signal MODE, the input/output circuit 15 allows an address signal or a control signal to be supplied from outside into the internal bus 14. The selective control of the registers Ra and Rb thus mapped is, but not specially limited to, performed by a selecting circuit 25 which constitute a functional module. The selecting circuit 25 receives an address signal supplied from outside through an address bus AB, and a read/write signal and a mode signal MODE supplied from outside through a control bus CB.

When the selecting circuit 25, to which above-mentioned signals are supplied, is being specified a test operation by a mode signal MODE is supplied from outside, if an address signal corresponding to the register Ra is supplied from outside and at the same time a read operation is specified by a read/write signal, the selecting circuit 25 asserts a selecting control signal $\phi ar$ and controls the output gate 20 to be in an ON state to make an interruption signal INT12 readable at the outside. In this case, if write operation is specified by a read/write signal the selecting circuit 25 asserts a selecting control signal $\phi aw$ to be given to a control terminal of the flip-flop circuit 21 to make a test signal TEST12 be latched by the flip-flop circuit 21.

When a fixed test operation is being specified by a mode signal MODE supplied from outside, if an address signal corresponding to the register Rb is supplied from outside and at the same time write operation is specified by a read/write signal a selecting control signal $\phi bw$ to be given to a control terminal of the flip-flop circuit 23 is asserted and a switchover control signal CONT12 is latched by the flip-flop circuit 23. When the switchover control signal CONT12 is in a high level, the multiplexer 22 selects an interruption signal INT12 and when the signal CONT12 is in a low level a latch signal of the flip-flop 21 is selected. In this case, if read operation is specified by a read/write signal, a selecting control signal $\phi br$ is asserted and a latch signal of the flip-flop circuit 23 is read out and it is output through the readout gate 24 to the data bus DB. A latch signal of the flip-flop circuit 23 takes a low level to be initialized by the reset signal RESET in response to initializing reset of the single-chip microcomputer 10.

Referring to FIG. 2, the explanation of operation of the embodiment described in the above is given in the following.

In a device test, when the outputting condition of an interruption signal INT12 is to be confirmed, the output gate 20 shall be controlled to be ON. In this state, an interruption signal INT12 output from the DMA controller 12 can be supplied to the data bus DB through the output gate 20 in a ON state; therefore the outputting condition of the interruption signal INT12 can be directly confirmed at the outside through the internal bus 14 which is interfaced with an external circuit. In this way, the outputting condition of the interruption signal INT12 can be simply confirmed without making the CPU 11, which receives the interruption signal INT12, perform the operation reflecting the state of the interruption signal INT12. By arranging the interruption signal INT12 not to be output from the multiplexer 22 in latching the high level switchover control signal CONT12 in the flip-flop circuit 23, when the interruption signal INT12 is to be directly confirmed in the outside, the specific operation of the CPU 11 can be automatically suppressed not to be started by the interruption signal INT12. In the case where the condition of an interruption signal INT12 is to be confirmed, it is therefore possible to facilitate the independent test of the DMA controller 12 by which the interruption signal is generated.

In a device test, if the operating condition of the CPU is to be confirmed when interruption is specified by an interruption signal INT12, the latched data of the flip-flop circuit 21 is output to the multiplexer 22 in latching a high level switchover control signal CONT12 in the flip-flop circuit 23. In this state, if a test signal TEST12 which is directly supplied from outside to the data bus DB is latched in the flip-flop circuit 21, the latched data is supplied to the CPU 11 in place of the interruption signal INT12. By this arrangement, without making the DMA controller 12 perform a necessary operation to obtain an outputting condition of the interruption signal INT12, the operating condition of the CPU when a fixed interruption is specified can be simply confirmed. At this time, a high level switchover control signal CONT12 is latched in the flip-flop circuit 23, and an interruption signal INT12 cannot be output from the multiplexer 22, so that even if an interruption signal INT12 for specifying interruption is actually output, the competition between a test signal TEST12 supplied from outside in place of the interruption signal INT12 and the interruption signal INT12 is avoided. When the operating condition of the CPU 11 is in the state where an interruption is specified is to be confirmed based on a test signal TEST12, the start of an interruption sequence of the CPU 11 by an original interruption signal INT12 is suppressed. In this way, an independent test from outside on the interruption sequence of the CPU 11 can be performed easily.

The test utilizing the other signal separation circuit 17 can be performed in the similar way.

Figure 3:
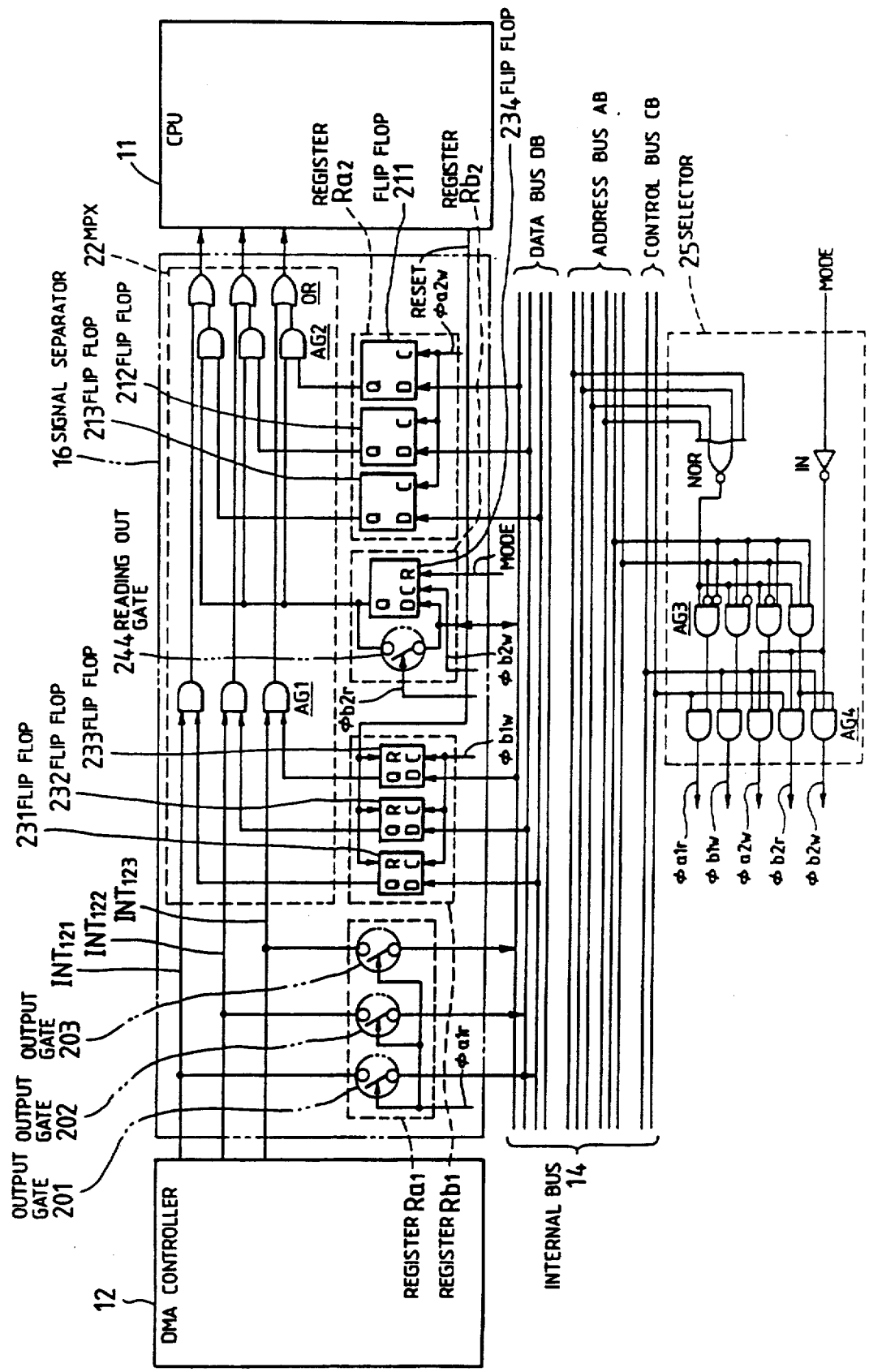
FIG. 3 is a block diagram showing another detailed example of a signal separator.

FIG. 3 shows an example of a detailed logical drawing of the signal separator 16 and the selector 25 shown in FIG. 2. In this embodiment, three interruption signals INT121, INT122 and INT123 are output from the DMA controller 12. The multiplexer 22 comprises an AND gate AG 1 which receives the interruption signals INT121, INT122 and INT123; an AND gate AG 2 which receives a test signal supplied from the data bus DB through register Ra2; an OR gate OR which transmits an output signal of AG 1 or AG 2 to the CPU 11. A control signal for AG 1 is supplied from the data bus DB through a register Rb1. A control signal for AG 2 is supplied from the data bus DB through a register Rb2. The interruption signals INT121, INT122 and INT123 can be sent out directly to the data bus DB through the register Ra1. Control signals $\phi a1r$, $\phi b1w$, $\phi a2w$, $\phi b2r$ and $\phi b2w$ for registers Ra1, Rb1, Rb2 and Ra2 are formed by the selector 25. The selector 25 comprises an AND gate AG 3 which receives an address signal on an address bus AB and a NOR gate NOR; and AND gate AG 4 which receives a control signal on the control bus CB and a reversed signal of a mode signal MODE. The reason why an address signal is used is that each register is mapped on the address area of the microcomputer. For example, the register Ra1 is mapped in address 0; the register Rb1 is mapped in address 1; the register Ra2 is mapped in address 2; the register Rb2 is mapped in address 3.

When a mode signal MODE is 0 the mode is in the test mode and when it is 1 the mode is in the normal operation mode. In the normal operation mode a flip-flop circuit 234 in the register Rb2 is reset by a MODE signal, so that the AND gate AG 2 is controlled to be in a nonconducting state; therefore the output of the register Ra2 comprising flip-flop circuits 211, 212 and 213 is not delivered to the CPU. In the normal operation mode, the register Rb1, comprising flip-flop circuits 231, 232 and 233, is used for allowing or prohibiting the transmission of interruption signals INT121, INT122, INT123 to the CPU 11 by controlling the AND gate AG 1. Output gates 201, 202 and 203 in the register Ra1 are used in the normal operation mode for monitoring the condition of an interruption signal. In the test mode, if 1 is written in a flip-flop circuit 234 in the register Rb2, the AND gate AG 2 is controlled to be in a conducting state, so that the output of the register Ra2, comprising flip-flop circuits 211, 212 and 213, can be input to the CPU. In this time, for the register Rb1, comprising flip-flop circuits 231, 232 and 233, if nothing is written, flip-flop circuits 231, 232 and 233 are reset, so that interruption signals INT121, INT122 and INT123 are not delivered to the CPU. In the normal operation mode, a write signal $\phi a2w$ for the register Ra2, and a write signal $\phi b2w$ for the resister Rb2 do not reach an operating level, so that the addresses of Ra2 and Rb2, address 2 and address 3, can be used for other purposes in the normal operation mode.

Following this embodiment, the operation of the CPU 11 for the combination of conditions of interruption signals INT121, INT122 and INT123 can be tested without operating the DMA controller 12. As the CPU 11 can be tested without operating the DMA controller 12, even if the DMA controller 12 is changed for other functional modules the test pattern for the CPU 11 can be commonly used.

According to the embodiment described in the above, following functional effects are obtained.

(1) In a device test concerning individual signals among functional modules, there is no need to provide any additional bus for a test except the internal bus 14, so that the improvement in the degree of integration is not hindered.

(2) In a device test concerning individual signals such as interruption signals, owing to an arrangement that an individual signal output from a fixed functional module can be output to the internal bus 14 through the output gate 20, the outputting condition of the individual signal can be directly confirmed through the internal bus 14 which is interfaced with an external circuit. Because of this, the outputting condition of a desired individual signal can be simply confirmed without making a functional module, which is to receive the individual signal, perform an operation which is capable of reflecting the condition of the individual signal.

(3) In a device test concerning individual signals, such as a test signal TEST12, such a signal is directly supplied to the internal bus 14 from the outside and can be supplied to a desired functional module in place of an individual signal through the flip-flop circuit 21 and the multiplexer 22. Therefore, the operating condition of the functional module based on a desired individual signal can be simply confirmed without making a functional module, which would normally output the individual signal, perform an operation necessary to obtain a desired outputting condition.

(4) Signal separators 16 and 17 alternatively select the internal bus 14 or other functional module to receive an individual signal as a destination of a flow of the individual signal which is output from a fixed functional module, and also to serve to avoid competition between an individual signal output from a fixed functional module and a signal supplied from outside in place of an individual signal. Concerning individual signals which can be used as triggers to start a specified operation such as DMA request signals, interruption signals, or response signals for them, when the outputting condition of each of these individual signals is to be directly confirmed at the outside, a functional module, which is to receive the signal originally, is automatically suppressed from starting its original operation stimulated by the individual signal. When the operating condition of a functional module to receive a specified individual signal is to be confirmed based on a substitutive signal supplied from outside for an individual signal, the start of an original operation by the individual signal is automatically suppressed. In this way, it is facilitated to perform an independent test of a desired functional module concerning individual signals.

(5) Owing to the functional effects as described in item (2) to (4), the testing time of a device concerning individual signals is shortened and moreover the work of making test patterns is facilitated. For a semiconductor integrated circuit especially of the application specific system, in which each time when the combination of peripheral functional modules to be adopted differs according to requested specifications, test patterns have to be renewed, the time spent for the renewal work of patterns is much decreased.

(6) Signals supplied from outside in place of individual signals are once latched in a latch circuit such as the flip-flop circuit 21 before they are supplied to specific functional modules; therefore a substitutive signal with a length or a waveform, which is requested to an individual signal from the point of view of timing, can be supplied to a specific functional module. Because of this, a signal separator with a certain hardware structure can be commonly utilized for various kinds of individual signals of different waveforms.

(7) When addresses are allotted to registers Ra and Rb included in signal separators 16 and 17, these can be commonly used with a mode signal MODE which is supplied from outside and they can be mapped in a proper address area. In doing so, various kinds of registers which are used exclusively for a device test can do without occupying part of the address area utilized in the normal operation other than device tests.

(8) The function to open individual signals to outside in time of need can contribute to the simplicity of debugging processes, for example, the technique can be used for the system debugging of a target machine or for the software debugging.

In the above, the invention invented by the present inventors is concretely explained based on an embodiment. But the present invention is not limited to the above embodiment; it can be modified in various ways in the region where its gist is observed.

For example, in the above embodiment the signal separator is constituted with the output gate 20, flip-flop circuit 21, multiplexer 22, flip-flop circuit 23 and reading out gate 24, but the reading out gate can be omitted or a test signal can be supplied directly to the multiplexer 22 without using the flip-flop 21. The output selecting control for the multiplexer 22 can be directly performed by a mode signal.

Addresses allotted to registers Ra and Rb included in signal separators are not necessarily mapped in an address area in which mode signals are commonly used, but they can be mapped in the same address area as the registers included in various kinds of functional modules.

The signal separator can be included in the functional module which generates an individual signal. In this case, registers included in the signal separator can be disposed in the same address area as the registers included in the function module; in response to it the circuit to select a register can be constituted with the same circuit as the circuit included the functional module for selecting other registers.

In the above embodiment, the signal separator is adopted as a means to facilitate a device test, but in the same way as the output gate in the above embodiment, if only an output gate which is capable of outputting an individual signal selectively to the internal bus is provided, the outputting condition of a desired individual signal can be simply confirmed without making a functional module, which is to receive the individual signal, perform an operation which can reflect the condition of the individual signal. In this case, it is possible to add an input gate means which can selectively supply a signal supplied to the internal bus to a specified functional module in place of an individual signal. The input gate means can be a simple switch or a data latch circuit like the flip-flop circuit 21 shown in the above embodiment.

An individual signal is not limited to an interruption signal, DMA request signal or DMA response signal, and besides it widely means a coprocessor enable signal, a memory acknowledgment signal, etc. or various kinds of handshake signals.

In the above, the present invention invented by the present inventor is explained when it is applied to a single-chip microcomputer of an application specific system, which is the background of the present invention. The present invention however is not limited to the above but it can be widely applied to various kinds of microcomputers, LSI's and other semiconductor integrated circuits.

What is claimed is:

1. A semiconductor integrated circuit device, on a semiconductor substrate, having a test mode and a normal operation mode, said semiconductor integrated circuit device comprising:

a central processing unit operating in said test mode and said normal operation mode, said central processing unit having an input;

a functional module which selectively generates an interrupt signal;

an internal bus coupled to said central processing unit and said functional module;

an external terminal which receives an externally supplied test signal serving as a test interrupt signal in said test mode;

input and output means for interfacing said external terminal and said internal bus;

signal separating means coupled to said central processing unit, to said functional module and to said internal bus, for selectively supplying said interrupt signal from said functional module to said input of said central processing unit when said semiconductor integrated circuit device is in said normal operation mode and for selectively supplying said externally supplied test signal input to said internal bus via said external terminal and said input and output means to said input of said central processing unit in response to a first control signal supplied from a control signal forming circuit, when said semiconductor integrated circuit device is in said test mode, thereby testing an operation of said central processing unit, of said semiconductor integrated circuit device, responding to said test signal.

2. A semiconductor integrated circuit device according to claim 1, wherein said functional module is at least one of a direct-memory-access controller and a timer circuit.

3. A semiconductor integrated circuit device according to claim 1, wherein said signal separating means further includes a gate means for supplying said interrupt signal supplied from said control signal forming circuit to said internal bus in response to a second control signal when said semiconductor integrated circuit device is in said test mode and wherein said interrupt signal on said internal bus is outputted to 4. A semiconductor integrated circuit device according to claim 3, wherein said control signal forming circuit, is connected to said internal bus and to said signal separating means, for forming one of said first control signal and said second control signal based on a signal on the internal bus.

5. A semiconductor integrated circuit device according to claim 4, wherein said internal bus includes a data bus, an address bus, and a control bus, wherein said interrupt signal is supplied to said data bus through said gate means, wherein said test signal is supplied from said data bus to said signal separating means, and wherein said first and second control signals are formed by said control signal forming circuit based on an address signal on said address bus and another control signal on said control bus.

6. A semiconductor integrated circuit device according to claim 5, wherein said control signal forming circuit is connected to said input and output means and forms said first and second control signals based on said address signal, said another control signal and a test mode signal supplied thereto through said input and output means from an external terminal.

7. A microcomputer having a normal operation mode and a test mode, the microcomputer being in the test mode in response to a test mode signal, the microcomputer comprising:

a CPU operating in said test mode and said normal operation mode;

a direct-memory-access controller;

a timer;

an input and output circuit connected to an external terminal;

an internal bus coupled to said input and output circuit, to said CPU, to said direct-memory-access controller and to said timer;

a first signal separator means connected to said CPU, to said direct-memory-access controller and to said internal bus, wherein said first signal separator means selectively supplies a first interrupt signal, generated internally to the semiconductor integrated circuit device, output from said direct memory access controller to said CPU when said microcomputer is in said normal operation mode and selectively supplies a first externally supplied test signal input to the internal bus via said external terminal and said input and output circuit to said CPU in response to a first control signal supplied from a control signal forming means when said microcomputer is in said test mode, thereby testing an operation of said CPU, of said semiconductor integrated circuit device, responding to said first test signal; and a second signal separator means connected to said CPU, to said timer and to said internal bus, wherein said second separator means selectively supplies a second interrupt signal, generated internally to the semiconductor integrated circuit device, output from said timer to said CPU when said microcomputer is in said normal operation mode and selectively supplies a second externally supplied test signal input to said internal bus via said external terminal and said input and output circuit to said CPU in response to a second control 8. A microcomputer according to claim 7, wherein an output section of said control signal forming means is connected to said first and second signal separator means, for forming at least one of said first and second control signals based on a signal on said internal bus.

9. A microcomputer according to claim 8, wherein said internal bus includes a data bus, an address bus and a control bus, wherein said microcomputer further comprises:
 a first transmission means for supplying at least one of said first interrupt signal from said first signal separator circuit to said data bus and said first test signal from said data bus to said first signal separator circuit; and
 a second transmission means for supplying at least one of said second interrupt signal from said second signal separator circuit to said data bus, and said second test signal from said data bus to said second signal separator circuit.

10. A microcomputer according to claim 9, wherein said first and second control signals are formed based on said test mode signal supplied through at least one external terminal and said input and output circuit, an address signal on said address bus and a control signal on said control bus.

11. A semiconductor integrated circuit device comprising:
 a central processing unit operating in a test mode and a normal operation mode;
 a functional module which selectively generates an interrupt signal;
 an input and output means connected with an external terminal;
 an internal bus connected to said input and output means, to said central processing unit and to said functional module;
 a multiplexer having i) an output connected to said central processing unit, ii) a first input port connected to said functional module and iii) a second input port;
 a first transmission means for supplying said interrupt signal, being sent from said functional module to said first input port of said multiplexer, to said internal bus;
 a second transmission means for supplying an externally supplied test signal input to said internal bus via said external terminal and said input and output means, to said second input port of said multiplexer;
 a first control circuit for selectively controlling operations of said first and second transmission means so that in said test mode said first transmission means supplies said interrupt signal to said internal bus or said second transmission means supplies said test signal to said second input port of said multiplexer; and
 a second control circuit connected between said multiplexer and said internal bus for controlling a selecting operation of said multiplexer so that in said normal operation mode said interrupt signal on said first input port is selectively supplied to said output port and in said test mode said test signal on said second input port is supplied to said output port, thereby testing operations of said central processing unit and said functional module individually.

12. A semiconductor integrated circuit device according to claim 11, wherein said internal bus comprises a data bus, an address bus and a control bus, and wherein said second control circuit includes a first sustaining circuit for sustaining a control signal on said control bus, said first sustaining circuit supplying said control signal to a control port of said multiplexer to control the operation of said multiplexer.

13. A semiconductor integrated circuit device according to claim 12, wherein said first transmission means contains a first gate means to supply said interrupt signal to said data bus at a specified timing in said test mode, and,
 said second transmission means has a second sustaining circuit for sustaining said test signal which is supplied through said data bus, and sending said test signal to said second input port of said multiplexer.

14. A semiconductor integrated circuit device according to claim 13, wherein said functional module is at least one of a direct-memory-access controller and a timer.

15. A semiconductor integrated circuit device according to claim 14, further including a third transmission means to send an output signal of said first sustaining circuit to said data bus at a specified timing.

16. A semiconductor integrated circuit device according to claim 15, wherein said first control circuit selectively controls said first gate means, said third transmission means, said first sustaining circuit and said second sustaining circuit in response to reception of an address signal on said address bus, said control signal on said control bus and said test mode signal.

17. A single chip microcomputer comprising:
 a central processing unit (CPU) operating in a test mode and a normal operation mode;
 a direct-memory-access controller;
 a timer circuit;
 an input and output means connected to an external terminal;
 an internal bus selectively connectable to the input and output means, the CPU, the direct-memory-access controller and the timer circuit;
 a first signal separator means connected to the CPU, the direct-memory-access controller and the internal bus, wherein the first signal separator means selectively supplies a first signal which is an interrupt signal output from the direct-memory-access controller to the CPU in the normal operation mode, wherein the first signal separator means selectively supplies a second signal from the internal bus to the CPU in the test mode, the second signal being another interrupt signal, the second signal being supplied to the CPU in place of the first signal so as to test an operation of the CPU;

a second signal separator means connected to the CPU, the timer circuit and the internal bus, wherein the second signal separator means selectively supplies a third signal output from the timer circuit to the CPU in the normal operation mode, wherein the second signal separator means supplies a fourth signal from the internal bus to the CPU in the test mode, the fourth signal being a test interrupt signal, the fourth signal being supplied to the CPU in place of the third signal so as to test an operation of the CPU; and a control circuit for controlling operations of the first and second signal separator means, the control circuit having an output connected to the first and second signal separator means and an input connected to the internal bus, the control circuit being responsive to signals on the internal bus and generating a selecting signal for selecting one of the first and second signal separator means so as to operate the selected one of the first and second signal separator means.

18. A single-chip microcomputer having a test mode and a normal operating mode, the single-chip microcomputer being in the test mode when receiving a test mode signal, the single-chip microcomputer comprising:

an internal bus including an address bus, a data bus and a control bus;

a central processing unit coupled to the internal bus and having an input;

a function module which is coupled to the internal bus and which selectively supplies an interrupt signal;

external terminals;

an input circuit coupled between the external terminals and the internal bus;

a multiplexer having an output coupled to the input of the central processing unit, a first input coupled to receive the interrupt signal, a second input coupled to receive a test interrupt signal and a control input coupled to receive control data, the multiplexer being responsive to the control data and generating the test interrupt signal on the second input thereof at the output thereof instead of the interrupt signal on the first input thereof;

a first register including a first flip-flop circuit having an input coupled to the data bus, an output coupled to the second input of the multiplexer and a control terminal coupled to receive a first select signal, the first flip-flop circuit being responsive to the first select signal and latching the test interrupt signal supplied from at least one of the external terminals to the data bus via the input circuit in the test mode;

a second register including a second flip-flop circuit having an input coupled to the data bus, an output coupled to the control terminal of the multiplexer and a control terminal coupled to receive a second select signal, the second flip-flop circuit being responsive to the second select signal and latching the control data supplied from at least one of the external terminals to the data bus via the input circuit in the test mode;

selector means coupled to the address bus and to the control bus and responsive to the mode control signal, an address signal on the address bus and a control signal on the control bus and for generating the first or second select signal to the control terminal of the first or second flip-flop circuit which is designated by the address signal, whereby an interrupt sequence of the central processing unit is tested without generating the interrupt signal from the function module.

19. A single-chip microcomputer according to claim 18, further comprising:

an output circuit coupled between the external terminal and the internal bus, wherein the first register further includes a gate circuit coupled to receive a third select signal from the selector means and responsive to the third select signal and for outputting the interrupt signal to at least one of the external terminals via the data bus and the output circuit, thereby testing an operation of the function module.

20. A single-chip microcomputer according to claim 19, wherein the first register further includes a gate circuit coupled to receive a fourth select signal from the selector means and responsive to the fourth selector signal and for outputting the control data to at least one of the external terminals via the data bus and the output circuit to confirm the control data.

21. A single-chip microcomputer according to claim 19, wherein the function module is a direct-memory-access controller.

22. A single-chip microcomputer according to claim 19, wherein the function module is a timer circuit.

* * * * *

UNITED STATES PATENT AND TRADEMARK OFFICE
CERTIFICATE OF CORRECTION

PATENT NO. : 5,228,139
DATED : July 13, 1993
INVENTOR(S) : Yoshiyuki Miwa, et al.

It is certified that error appears in the above-identified patent and that said Letters Patent is hereby corrected as shown below:

Claim 3, column 10, line 28, after "outputted to" insert
--outside of said semiconductor integrated circuit device
thereby testing an operation of said function module.--

Claim 7, column 11, line 25, after "control" insert
--signal supplied from said control signal forming means
when said microcomputer is in said test mode.--

Claim 20, column 14, line 44, after "fourth" delete "selector"
and substitute therefor --select--.

Signed and Sealed this

Twenty-second Day of February, 1994

Attest:

BRUCE LEHMAN

*Attesting Officer*   *Commissioner of Patents and Trademarks*